(12) United States Patent
Strutz et al.

(10) Patent No.: US 9,111,772 B1
(45) Date of Patent: Aug. 18, 2015

(54) ELECTRONIC ARRAY AND CHIP PACKAGE (71) Applicant: Infineon Technologies AG, Neubiberg (DE)

(72) Inventors: Volker Strutz, Tegernheim (DE); Horst Theuss, Wenzenbach (DE); Chee Voon Tan, Seremban (MY); Hui Teng Wang, Muar (MY)

(73) Assignee: INFINEON TECHNOLOGIES AG, Neubiberg (DE)

( * ) Notice: Subject to any disclaimer, the term of this patent is extended or adjusted under 35 U.S.C. 154(b) by 16 days.

(21) Appl. No.: 14/166,880

(22) Filed: Jan. 29, 2014

(51) Int. Cl.
*H01L 29/06* (2006.01)

(52) U.S. Cl.
CPC .................... *H01L 29/0649* (2013.01)

(58) Field of Classification Search
CPC ............ H01L 21/6224; H01L 21/6264; H01L 21/763
See application file for complete search history.

(56) References Cited

U.S. PATENT DOCUMENTS

2012/0193779 A1* 8/2012 Lee et al. ................. 257/737

\* cited by examiner

*Primary Examiner* — Mohammad Islam
*Assistant Examiner* — Charles R Peters (57) ABSTRACT

An electronic array may include a first electronic component which has a first operation voltage, a second electronic component which has a second operation voltage, wherein the second operation voltage is different from the first operation voltage and wherein the first electronic component and the second electronic component are arranged over each other, an isolation layer between the first electronic component and the second electronic component, wherein the isolation layer electrically isolates the first electronic component from the second electronic component, at least one connection layer formed at least partially between the isolation layer and the first electronic component or between the isolation layer and the second electronic component, wherein the connection layer includes a first portion and a second portion, wherein the first portion and the second portion each extend from the corresponding electronic component to the isolation layer, wherein the first portion includes an electrically isolating material which fixes the isolation layer to the corresponding electronic component and wherein the second portion includes an electrically conductive material which electrically couples the corresponding electronic component to the isolation layer.

25 Claims, 3 Drawing Sheets

FIG 1 <State of the art>

FIG 2 <State of the art>

FIG 5

ELECTRONIC ARRAY AND CHIP PACKAGE

TECHNICAL FIELD

Various embodiments relate generally to an electronic array and a chip package.

BACKGROUND

In order to provide an electrical isolation between two electronic components or parts, for example between a substrate and a semiconductor die which is mounted onto the substrate or a semiconductor die mounted on another semiconductor die, the electrical isolation should show a low tendency for electro-chemical migration effects and for partial discharge effects.

Electro-chemical migration (ECM) in general is the migration of metal ions through a polymer matrix or along an interface of a polymer matrix. ECM is typically accelerated by electrical fields and humidity. Furthermore, ECM might be accompanied by chemical effects within the polymer matrix. Certain traces of materials, such as e.g. Cl or S, in the polymer matrix accelerate the effect. ECM eventually might even lead to a formation of short circuits between high and low voltage electronic components. Typical substances being prone to ECM effects are conductive glues, i.e. polymers filled with metallic particles (typically Ag, Au, Ni, Sn, Pt, Pd or alloys thereof). The materials not only migrate through the polymer matrix of the glue but also through adjacent materials, e.g. mold compounds or other encapsulation materials. ECM-induced growth of conductive paths may lead to a degradation in the isolation properties (break-through-voltage) and therefore to a reduction in the lifetime of an electronic product.

Partial Discharge (PD) in general is the local re-arrangement of electrical charges in the vicinity of inhomogeneities, for example in voids. Such an effect may lead to a partial degradation of a corresponding material and may reduce break-through isolation properties and thus, the lifetime of a product.

In order to avoid ECM and/or PD, a non-conductive glue may be used, wherein such a glue may have limited isolation properties what may lead to a low break-through-voltage and partial discharge. Alternatively, a glued isolation platelet including for example glass, oxidized silicon, ceramic and/or an organic material may be used between the two electronic components. However, this platelet again may be glued either using non-conductive glue what may lead to the above PD problems or using a conductive glue, wherein the platelet itself may be configured to provide sufficient isolation, what may solve the PD-challenge, but may be prone to the above described ECM problems.

SUMMARY

An electronic array may include a first electronic component which has a first operation voltage, a second electronic component which has a second operation voltage, wherein the second operation voltage is different from the first operation voltage and wherein the first electronic component and the second electronic component are arranged over each other, an isolation layer between the first electronic component and the second electronic component, wherein the isolation layer electrically isolates the first electronic component from the second electronic component, at least one connection layer formed at least partially at least one of between the isolation layer and the first electronic component or between the isolation layer and the second electronic component, wherein the connection layer includes a first portion and a second portion, wherein the first portion and the second portion each extend from the corresponding electronic component to the isolation layer, wherein the first portion includes an electrically isolating material which fixes the isolation layer to the corresponding electronic component and wherein the second portion includes an electrically conductive material which electrically couples the corresponding electronic component to the isolation layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In various embodiments, an electronic array may be provided. The electronic array may include a first electronic component and a second electronic component. The first electronic component may have a first operation voltage. The second electronic component may have a second operation voltage. The second operation voltage may be different from the first operation voltage. The first electronic component and the second electronic component may be arranged over each other. An isolation layer may be formed between the first electronic component and the second electronic component. The isolation layer may electrically isolate the first electronic component from the second electronic component. At least one connection layer may be formed at least partially between the isolation layer and the first electronic component. Alternatively or additionally, at least one connection layer may be formed at least partially between the isolation layer and the second electronic component. The connection layer may include a first portion and a second portion. The first portion and the second portion may extend from the corresponding electronic component to the isolation layer. The first portion may include an electrically isolating material which may fix the isolation layer to the corresponding electronic component. The second portion may include an electrically conductive material which may electrically couple the corresponding electronic component to the isolation layer.

The operation voltage may be the voltage which may be applied to the corresponding electronic component during normal operation of the corresponding component. The first operation voltage may be different from the second operation voltage.

In various embodiments, the electronic array may include as the connection layer a first connection layer which may be formed at least partially between the isolation layer and the first electronic component. The first connection layer may include a first portion and a second portion of the first connection layer. The first portion and the second portion of the first connection layer may extend from the first electronic component to the isolation layer. The first portion of the first connection layer may include an electrically isolating material which may fix the isolation layer to the first electronic component. The second portion of the first connection layer may include an electrically conductive material which may electrically couple the first electronic component to the isolation layer.

Alternatively or additionally, in various embodiments, the electronic array may include as the connection layer a second connection layer. The second connection layer may be formed at least partially between the isolation layer and the second electronic component. The second connection layer may include a first portion and a second portion of the second connection layer. The first portion and the second portion of the second connection layer may extend from the second electronic component to the isolation layer. The first portion of the second connection layer may include an electrically isolating material which may fix the isolation layer to the second electronic component. The second portion of the second connection layer may include an electrically conductive material which may electrically couple the second electronic component to the isolation layer.

In various embodiments, a first charge distribution layer may be formed between the first connection layer and the isolation layer. The first and the second portion of the first connection layer may extend from the first electronic component to the first charge distribution layer. Alternatively or additionally, a second charge distribution layer may be formed between the second connection layer and the isolation layer. The first and the second portion of the second connection layer may extend from the second electronic component to the second charge distribution layer.

In various embodiments the first charge distribution layer may (physically, in other words directly) contact the isolation layer. Additionally or alternatively, the second charge distribution layer may (physically, in other words directly) contact the isolation layer.

In various embodiments, the second portion of the first connection layer may be embedded in the first portion of the first connection layer in a lateral direction. Alternatively or additionally, the second portion of the second connection layer may be embedded in the first portion of the second connection layer in a lateral direction.

In various embodiments, the first portion and/or the second portion of the first connection layer may be formed partially outside of the space between the first electronic component and the isolation layer. Alternatively or additionally, the first portion and/or the second portion of the second connection layer may be formed partially outside of the space between the second electronic component and the isolation layer.

For example, the first portion and/or the second portion of the first connection layer and/or the second connection layer may protrude from the space between the first and/or the second electronic component, respectively, and the isolation layer. For example, the first portion and/or the second portion of the first connection layer and/or the second connection layer may be formed at least partially at an outer side surface of the first electronic component and/or the second electronic component and/or the isolation layer.

In various embodiments, the first portion of the first connection layer and/or the first portion of the second connection layer may include an adhesive and/or a mold material and/or an embedding material. For example, the first portion of the first connection layer and/or the first portion of the second connection layer may include an isolating resin In various embodiments, the second portion of the first connection layer and/or the second portion of the second connection layer may include a conductive adhesive, a conductive spacer, a solid metal and/or one or more conductive particles. The conductive adhesive, the conductive spacer, the solid metal and/or the one or more conductive particles may extend from the corresponding electronic component to the isolation layer. The conductive resin may include an isolating resin filled with conductive particles or conductively coated isolating particles, for example metal coated polymer particles.

In various embodiments, the first charge distribution layer and/or the second charge distribution layer may include titanium nitride and/or doped silicon.

In various embodiments, the second voltage may be higher than the first voltage.

In various embodiments, the first electronic component may include a first chip or die.

In various embodiments, the second electronic component may include a carrier, a second chip or die and/or a substrate and/or a carrier.

In various embodiments, a method for manufacturing an electronic array may be provided. The method may include: forming an isolation layer between a first electronic component and a second electronic component, wherein the isolation layer may be configured to electrically isolate the first electronic component from the second electronic component; forming at least one connection layer at least partially between the first electronic component or the second electronic component; wherein the connection layer may be formed by at least one first portion and at least one second portion, wherein the first portion and the second portion of the connection layer may extend from the corresponding electronic component to the isolation layer, wherein the first portion of the connection layer may include an electrically isolating material which may fix the isolation layer to the corresponding electronic component, and wherein the second portion of the connection layer may include an electrically conductive material which provides an electrical bridge from the corresponding electronic component to the isolation layer.

In various embodiments, a first connection layer may be formed at least partially between the isolation layer and the first electronic component. The first connection layer may be formed such that it may include a first portion and a second portion of the first connection layer. The first portion and the second portion of the first connection layer may be configured to extend from the first electronic component to the isolation layer. The first portion of the first connection layer may include an electrically isolating material which fixes the isolation layer to the first electronic component. The second portion of the first connection layer may include an electrically conductive material which may electrically couple the first electronic component to the isolation layer. Alternatively or additionally, a second connection layer may be formed at least partially between the isolation layer and the second electronic component. The second connection layer may be formed such that it may include a first portion and a second portion of the second connection layer. The first portion and the second portion of the second connection layer may be configured to extend from the second electronic component to the isolation layer. The first portion of the second connection layer may include an electrically isolating material which may fix the isolation layer to the second electronic component. The second portion of the second connection layer may include an electrically conductive material which may electrically couple the second electronic component to the isolation layer.

In various embodiments, the material of the first portion may be arranged in liquid form.

In various embodiments, a chip package may be provided. The chip package may include a first chip and a second chip, wherein the first chip may be arranged over the second chip. An isolation layer may electrically isolate the first chip from the second chip. At least one connection layer may be formed at least partially between the isolation layer and the first chip or between the isolation layer and the second chip. The connection layer may include at least one first portion and at least one second portion of the connection layer. The first portion and the second portion of the connection layer may extend from the corresponding chip to the isolation layer. The first portion of the connection layer may include an electrically isolating material which may fix the isolation layer to the corresponding chip. The second portion of the connection layer may include an electrically conductive material which may provide an electrical bridge from the corresponding chip to the isolation layer.

In various embodiments, a first connection layer may be formed as the connection layer at least partially between the isolation layer and the first chip. The first connection layer may include a first portion and a second portion of the first connection layer. The first portion and the second portion of the first connection layer may extend from the first chip to the isolation layer. The first portion of the first connection layer may include an electrically isolating material which may fix the isolation layer to the first chip. The second portion of the first connection layer may include an electrically conductive material which may electrically couple the first chip to the isolation layer. Alternatively or additionally, a second connection layer may be formed as the connection layer at least partially between the isolation layer and the second chip. The second connection layer may include a first portion and a second portion of the second connection layer. The first portion and a second portion of the second connection layer may extend from the second chip to the isolation layer. The first portion of the second connection layer may include an electrically isolating material which may fix the isolation layer to the second chip. The second portion of the second connection layer may include an electrically conductive material which may electrically couple the second chip to the isolation layer.

In various embodiments, a first charge distribution layer may be formed between the first connection layer and the isolation layer. The first portion and the second portion of the first connection layer may extend from the first chip to the first charge distribution layer. Alternatively or additionally, a second charge distribution layer may be arranged between the second connection layer and the isolation layer. The first and the second portion of the second connection layer may extend from the second chip to the second charge distribution layer.

In various embodiments, the first portion of the first connection layer may surround the second portion of the first connection layer in a lateral direction. Alternatively or additionally, the first portion of the second connection layer may surround the second portion of the second connection layer in a lateral direction.

In various embodiments, the first portion and/or the second portion of the first connection layer may protrude from the space between the first chip and the isolation layer and/or the first portion and/or the second portion of the second connection layer may protrude from the space between the second chip and the isolation layer.

In various embodiments, the first chip may be a low voltage component and the second chip may be a high voltage component. An operation voltage of the second chip may be higher than an operation voltage of the first chip.

In various embodiments, the chip package may be configured as a current sensor.

In various embodiments, a method for manufacturing a chip package may be provided. The method may include: providing a first chip; providing a second chip; forming an isolation layer over the second chip; forming at least one connection layer at least partially over the second chip and/or over the isolation layer; arranging the first chip over the isolation layer and over the connection layer, wherein the isolation layer may electrically isolate the first chip from the second chip, wherein the connection layer may be formed by at least one first portion and at least one second portion of the connection layer, wherein the first portion and the second portion of the connection layer may extend from the corresponding chip to the isolation layer, wherein the first portion of the connection layer may include an electrically isolating material which may fix the isolation layer to the corresponding chip, and wherein the second portion of the connection layer may include an electrically conductive material which may provide an electrical bridge from the corresponding chip to the isolation layer.

In various embodiments, a first connection layer may be formed at least partially between the isolation layer and the first chip. The first connection layer may be formed such that it may include a first portion and a second portion of the first connection layer. The first portion and the second portion of the first connection layer may be configured to extend from the first chip to the isolation layer. The first portion of the first connection layer may include an electrically isolating material which may fix the isolation layer to the first chip. The second portion of the first connection layer may include an electrically conductive material which may electrically couple the first chip to the isolation layer and/or which may form a conductive bridge from the first chip to the isolation layer.

Alternatively or additionally, a second connection layer may be formed at least partially between the isolation layer and the second chip. The second connection layer may be formed such that it may include a first portion and a second portion of the second connection layer. The first portion and the second portion of the second connection layer may be configured to extend from the second chip to the isolation layer. The first portion of the second connection layer may include an electrically isolating material which may fix the isolation layer to the second chip. The second portion of the second connection layer may include an electrically conductive material which may electrically couple the second chip to the isolation layer and/or which may form a conductive bridge from the second chip to the isolation layer.

In various embodiments, the material of the first portion of the first connection layer and/or the material of the first portion of the second connection layer may be arranged in liquid form.

Figure 1:
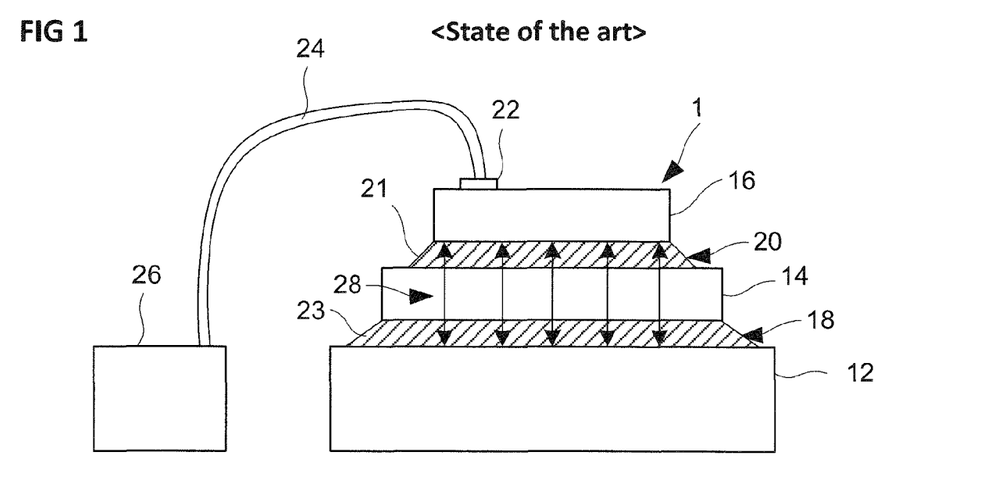
FIG. 1 shows a side view of a conventional electronic array.

FIG. 1 shows a side view of a conventional chip package 1. The conventional chip package 1 includes a first chip 16, a substrate, and a second chip 12. The first chip 16 is arranged over the second chip 12. The conventional chip package 1 may be configured as a current sensor. For example, the first chip 16 may be configured to conduct a current to be measured and the second chip 12 may be configured to measure the current being conducted through the first chip 16. The first chip 16 may have a first operation voltage. The second chip 12 may have a second operation voltage. The second operation voltage is different from the first operation voltage. The second voltage usually is a high operation voltage. The operation voltage usually is the voltage which is applied to the corresponding chip 12, 16 during normal operation of the corresponding chip 12, 16.

An isolation layer 14 is formed between the first electronic component 16 and the second electronic component 12. The isolation layer 14 electrically isolates the first chip 16 from the second chip 12. The isolation layer 14 may include a passivation layer or a glass substrate or a plastic substrate.

A first connection layer 20 usually is formed between the isolation layer 14 and the first chip 16. Alternatively or additionally, a second connection layer 18 is formed between the isolation layer 14 and the second chip 12. The first connection layer 20 extends from the first chip 16 to the isolation layer 14. The first connection layer 20 may include an electrically isolating material which may fix the isolation layer 14 to the first chip 16.

The second connection layer 18 usually is formed between the isolation layer 14 and the second chip 12. The second connection layer 18 extends from the second chip 12 to the isolation layer 14. The second connection layer 18 includes an electrically isolating material which fixes the isolation layer 14 to the second chip 12.

A first electromagnetic field 28 usually is produced between the first chip 16 and the second chip 12 because of the different operating voltages of the first and the second chip 16, 12 during normal operation of the conventional chip package 1. The first electromagnetic field 28 usually extends from a surface of the first electronic component 16 facing the isolation layer 14 to a surface of the second electronic component 12 facing the isolation layer 14 because the first and the second connection layer 18, 20 and the isolation layer 14 usually act as dielectrics.

So, the first and the second connection layer 18, 20 usually are exposed to the first electromagnetic field 28. This may lead to partial discharge effects (PD). PD is a local re-arrangement of electrical charges in the vicinity of inhomogeneities, for example voids, under the influence of the high voltage between the first chip 16 and the second chip 12. This usually leads to a partial degradation of the first and/or the second connection layer 20, 18 with time and/or at a certain point in time to a voltage break-through and/or to a serious damage of the conventional chip package 1. This may shorten a lifetime of the conventional chip package 1.

Figure 2:
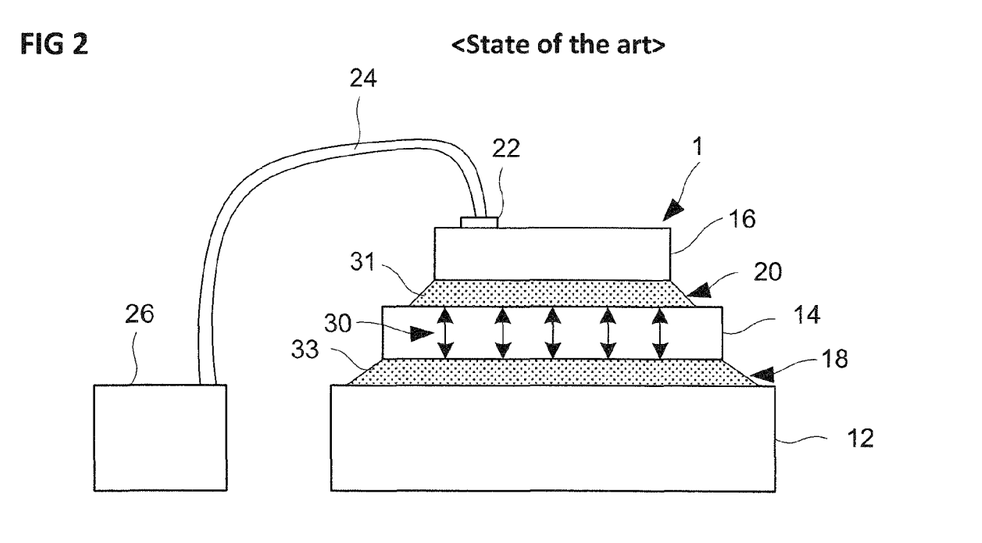
FIG. 2 shows a side view of a conventional electronic array.

FIG. 2 shows a side view of a conventional chip package 1. The conventional chip package 1 may widely correspond to the conventional chip package 1 shown in FIG. 1. The first connection layer 20 usually includes an electrically conductive material which usually electrically couples the first electronic component 16 to the isolation layer 14. The second connection layer 18 usually includes an electrically conductive material which usually electrically couples the second electronic component 12 to the isolation layer 14.

The first connection layer 20 and/or the second connection layer 18 usually include a conductive adhesive and/or one or more conductive particles, wherein the size of the particles is much smaller than the distance between the first connection layer 20 and/or the second connection layer 18 and the isolation layer 14.

A second electromagnetic field 30 usually is produced between the first chip 16 and the second chip 12 because of the different operating voltages of the first and the second chip 16, 12 during normal operation of the conventional chip package 1. The second electromagnetic field 30 usually extends from a surface of the first connection layer 20 facing the isolation layer 14 to a surface of the second connection layer 18 facing the isolation layer 14, because the first and the second connection layer 18, 20 act as electric conductors and because only the isolation layer 14 act as a dielectric.

So, the first and the second connection layer 18, 20 usually are not exposed to the first electromagnetic field 28. However, using the conductive material over the whole connection layer 20, 18 usually leads to strong migration effects, in particular electrochemical migration effects (ECM). ECM is the migration of metallic particles, for example particles used as filler material in the matrix of the conductive adhesive, of the first and/or the second connection layer 20, 18. This effect sometimes occurs combined with chemical effects, for example in mold compounds of the first and/or the second connection layer 20, 18, and may be accelerated by humidity and/or certain traces in the mold compound, e.g. S or Cl. ECM may shorten the lifetime of the conventional chip package 1.

Figure 3:
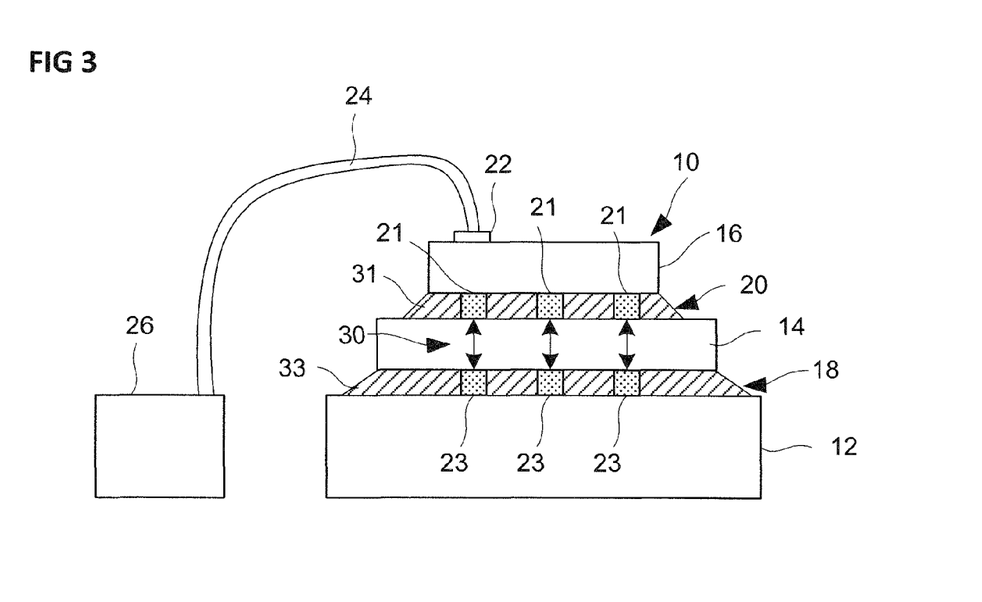
FIG. 3 shows a side view of an embodiment of an electronic array.

FIG. 3 shows a side view of an embodiment of an electronic array 10. The electronic array 10 may for example widely correspond to one of the conventional chip packages 1 explained above. The electronic array 10 may include a first electronic component 16, for example the first chip 16, and a second electronic component 12, for example the second chip 12. The first electronic component 16 may have the first operation voltage. The second electronic component 12 may have the second operation voltage. The second operation voltage may be different from the first operation voltage. The first electronic component 16 and the second electronic component 12 may be arranged over each other. The isolation layer 14 may be formed between the first electronic component 16 and the second electronic component 12. The isolation layer 14 may electrically isolate the first electronic component 16 from the second electronic component 12.

At least one connection layer 20 may be formed at least partially between the isolation layer 14 and the first electronic component 16. Alternatively or additionally, at least one connection layer 18 may be formed at least partially between the isolation layer 14 and the second electronic component 12. The connection layer 20, 18 may include a first portion 31, 33 and a second portion 21, 23. The first portion 31, 33 and the second portion 21, 23 may extend from the corresponding electronic component 16, 12 to the isolation layer 14. The first portion 31, 33 may include an electrically isolating material which may fix the isolation layer 14 to the corresponding electronic component 16, 12. The second portion 21, 23 may include an electrically conductive material which may electrically couple the corresponding electronic component 16, 12 to the isolation layer 14.

The operation voltage may be the voltage which may be applied to the corresponding electronic component 16, 12 during normal operation of the corresponding electronic component 16, 12. The first operation voltage may be different from the second operation voltage.

The electronic array 10 may include as the connection layer the first connection layer 20 which may be formed at least partially between the isolation layer 14 and the first electronic component 16. The first connection layer 20 may include the first portion 31 and the second portion 21 of the first connection layer 20. The first portion 31 and the second portion 21 of the first connection layer 20 may extend from the first electronic component 16 to the isolation layer 14. The first portion 31 of the first connection layer 20 may include an electrically isolating material which may fix the isolation layer 14 to the first electronic component 16. The second portion 21 of the first connection layer 20 may include an electrically conductive material which may electrically couple the first electronic component 16 to the isolation layer 14.

The electronic array 10 may include as the connection layer the second connection layer 18. The second connection layer 18 may be formed at least partially between the isolation layer 14 and the second electronic component 12. The second connection layer 18 may include the first portion 33 and the second portion 23 of the second connection layer 18. The first portion 33 and the second portion 23 of the second connection layer 18 may extend from the second electronic component 16 to the isolation layer 14. The first portion 33 of the second connection layer 18 may include an electrically isolating material which may fix the isolation layer 14 to the second electronic component 12. The second portion 23 of the second connection layer 18 may include an electrically conductive material which may electrically couple the second electronic component 12 to the isolation layer 14.

The second portion 21 of the first connection layer 20 may be embedded in the first portion 31 of the first connection layer 20 in a lateral direction. For example, the first connection layer 20 may include several second portions 21 of the first connection layer 20. At least some of the second portions 21 of the first connection layer 20 may be embedded in the first portion 31 of the first connection layer 20 in a lateral direction.

Alternatively or additionally, the second portion 23 of the second connection layer 18 may be embedded in the first portion 33 of the second connection layer 18 in a lateral direction. For example, the second connection layer 18 may include several second portions 23 of the second connection layer 18. At least some of the second portions 23 of the second connection layer 18 may be embedded in the first portion 33 of the second connection layer 18 in a lateral direction.

The first portion 31 and/or the second portion 21 of the first connection layer 20 may be partially formed outside of the space between the first electronic component 16 and the isolation layer 14. Alternatively or additionally, the first portion 33 and/or the second portion 23 of the second connection layer 18 may be partially formed outside of the space between the second electronic component 12 and the isolation layer 14.

For example, the first portion 31, 33 and/or the second portion 21, 33 of the first and/or the second connection layer 20, 18 may protrude from the space between the first and/or the second electronic component 16, 12, respectively, and the isolation layer 14. For example, the first portion 31, 33 and/or the second portion 21, 23 of the first and/or the second connection layer 20, 18 may be formed at an outer side surface of the first and/or the second electronic component 16, 12 and/or the isolation layer 14.

The second portion 21 of the first connection layer 20 and/or the second portion 23 of the second connection layer 18 may include a conductive adhesive, a conductive spacer, a solid metal, for example solder, and/or one or more conductive particles. The conductive adhesive, the conductive spacer, the solid metal and/or the one or more conductive particles may extend from the corresponding electronic component 16, 12 to the isolation layer 14. The conductive resin may include an isolating resin filled with conductive particles, for example metal particles, or conductively coated isolating particles, for example metal coated polymer particles.

The second electromagnetic field 30 may be produced between the first electronic component 16 and the second electronic component 12 because of the different operating voltages of the first and the second electronic component 16, 12 during normal operation of the electronic array 10. The second electromagnetic field 30 may extend from the surface of the first connection layer 20 facing the isolation layer 14 to the surface of the second connection layer 18 facing the isolation layer 14 because the first portions 21, 23 of the first and the second connection layer 18, 20 act as electric conductors and because only the isolation layer 14 act as a dielectric.

So, the first and the second connection layer 18, 20 may not be exposed to the first electromagnetic field 28 and only a view conductive particles and/or elements are present in the first and/or the second connection layer 18, 20. Therefore, the partial discharge effects and also the migration effects may be very small and/or may be negligible. This may lead to a long lifetime of the electronic array 10.

The positive effect of the second portions 21, 23 of the first and/or the second connection layer 20, 18 might be improved using conductive layers on the isolating platelet, i.e. the isolation layer 14. These layers may improve the electrical connection of the platelet to the conductive portion of the glue.

The electronic array 10 may for example be a chip package. The first electronic component 16 may for example be a first chip, a carrier or a substrate. The second electronic component 12 may for example be a second chip, for example a sensor chip. The electronic array 10 may be configured as a current sensor. For example, the first electronic component 16 may be configured to conduce a current to be measured and the second electronic component 12 may be configured to measure the current being conducted through the first electronic component 16. The first electronic component 16 may have a first operation voltage. The second electronic component 12 may have a second operation voltage. The second operation voltage may be different from the first operation voltage. For example the second voltage is a high operation voltage. The operation voltage may be the voltage which may be applied to the corresponding electronic component 12, 16 during normal operation of the corresponding electronic component 12, 16.

The isolation layer 14 may include a passivation layer or a glass substrate or a plastic substrate. The first connection layer 20 may include an electrically isolating material which may fix the isolation layer 14 to the first chip 16. The second connection layer 18 may include an electrically isolating material which may fix the isolation layer 14 to the second electronic component 12. The first connection layer 20 and/or the second connection layer 18 may include an adhesive and/or a mold material and/or an embedding material. For example, the first connection layer 20 and/or the second connection layer 18 may include an isolating resin. The first connection layer 20 may include an electrically conductive material which may electrically couple the first electronic component 16 to the isolation layer 14. The second connection layer 18 may include an electrically conductive material which may electrically couple the second electronic component 12 to the isolation layer 14. The first connection layer 20 and/or the second connection layer 18 may include a conductive adhesive and/or one or more conductive particles. For example, the first connection layer 20 and/or the second connection layer 18 may include an isolating resin filled with conductive particles, wherein the size of the particles is much smaller than the distance between the first connection layer 20 and/or the second connection layer 18 and the isolation layer 14. For example, the first connection layer 20 and/or the second connection layer 18 may be formed by a resin including silver particles.

Figure 4:
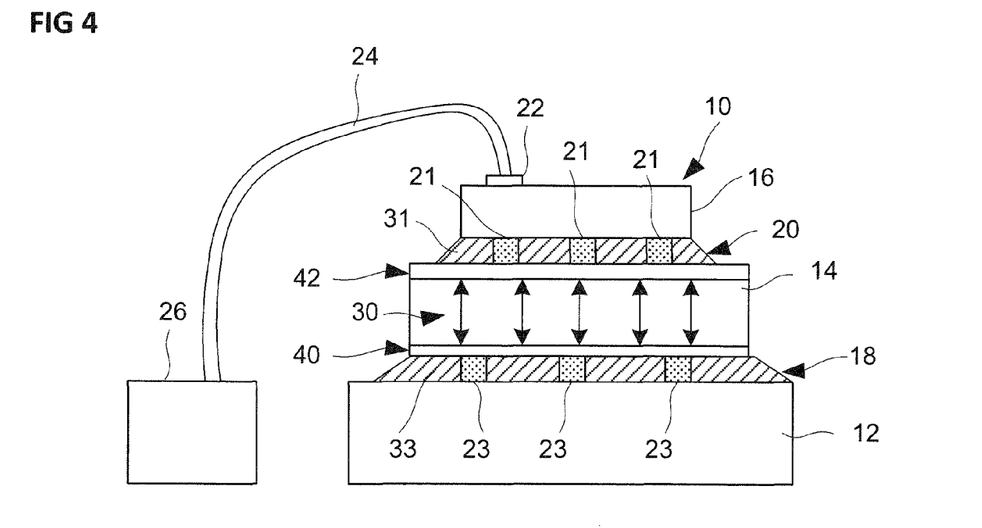
FIG. 4 shows a side view of an embodiment of an electronic array.

FIG. 4 shows a side view of an embodiment of an electronic array 10. The electronic array 10 may widely correspond to the electronic array 10 explained above. A first charge distribution layer 42 may be formed between the first connection layer 20 and the isolation layer 14. The first and the second portion 31, 21 of the first connection layer 20 may extend from the first electronic component 16 to the first charge distribution layer 42.

Alternatively or additionally, a second charge distribution layer 40 may be formed between the second connection layer 18 and the isolation layer 14. The first and the second portion 33, 23 of the second connection layer 18 may extend from the second electronic component 12 to the second charge distribution layer 40. The first charge distribution layer 42 may contact the isolation layer 14. Additionally or alternatively, the second charge distribution layer 40 may contact the isolation layer 14.

The first charge distribution layer 42 and/or the second charge distribution layer 40 may include Titan nitride and/or doped Silicon.

Figure 5:
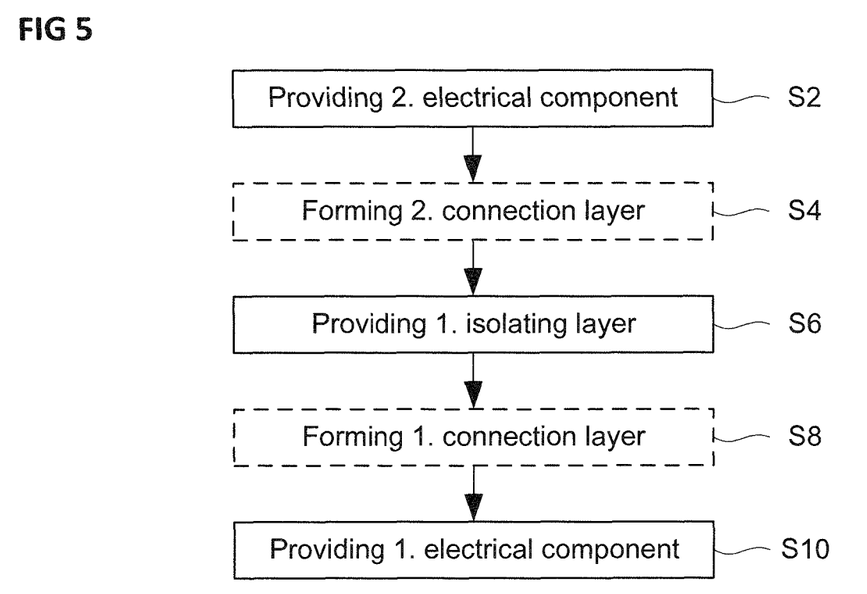
FIG. 5 shows a flowchart of an embodiment of a method for manufacturing an electronic array.

FIG. 5 shows a flowchart of an embodiment of a method for manufacturing an electronic array 10, for example one of the electronic arrays 10 explained above.

In S2 a second electronic component may be provided, for example the second electronic component 12 explained above.

In S4 a connection layer may be formed. For example, the second connection layer 18 may be formed over the second electronic component 12. In particular, the first portion 33 and the second portion 23 of the second connection layer 18 may be formed in S4. For example, the material of the first portion 33 and/or the second portion 23 of the second connection layer 18 may be arranged on the second electronic component 12 in liquid condition. For example, the material of the second portion 23 of second connection layer 18 may be arranged in a solid state on the second electronic component 12 and the material of the first portion 33 of the second connection layer 18 may be arranged on the second electronic component 12 in liquid condition such that the second portion 23 may be embedded in the first portion 33 in lateral direction.

In S6 an isolating layer may be provided. For example, the isolating layer 14 may be provided over the second electrical component 12 and/or the second connection layer 18. For example, the isolating layer 14 may include a platelet and may be arranged over the second electrical component 12 and/or the second connection layer 18 and/or the isolating layer 14 may include a layer structure and may be deposited over the second electrical component 12 and/or the second connection layer 18.

Optionally, in S6 a second charge distribution layer may be formed. For example, the second charge distribution layer 40 may be formed over the second connection layer 18 or the second charge distribution layer 40 may be formed on a surface of the isolating layer 14 facing the second connection layer 18.

Optionally, in S6 a first charge distribution layer may be formed. For example, the first charge distribution layer 42 may be formed on a surface of the isolating layer 14 facing away from the second electronic component 12.

In S8 a first connection layer may be formed. For example, the first connection layer 20 may be formed over the isolation layer 14. In particular, the first portion 31 and the second portion 21 of the first connection layer 20 may be formed in S8. For example, the material of the first portion 31 and/or the second portion 21 of the first connection layer 20 may be arranged on the isolation layer 14 or, in case, on the first charge distribution layer 42. For example, the material of the first portion 31 and/or the second portion 21 of the first connection layer 20 may be arranged in a liquid condition. For example, the material of the second portion 21 of first connection layer 20 may be arranged in a solid state over the isolation layer 14 and the material of the first portion 31 of the first connection layer 20 may be arranged over the isolation layer 14 in a liquid condition such that the second portion 21 may be embedded in the first portion 31 in lateral direction.

In S10 a first electronic component may be arranged. For example, the first electronic component 16 may be arranged over the isolating layer 14 and/or, in case, over the first connection layer 20. For example, the first electronic component 16 may be arranged on the isolating layer 14 or, in case, on the first connection layer 20.

The invention is not restricted on the embodiments explained above. For example, the electronic array 10 may only include the first connection layer 20 or the second connection layer 18. In this context, the isolation layer 14 may be deposited directly on the first electronic component 16 or the second electronic component 12. Further, the electronic array 10 may only include the first charge distribution layer 42 or the second charge distribution layer 40. Further, the electronic array 10 may include the first connection layer 20 and the second connection layer 18, but one of the connection layers 20, 18 may be formed in accordance with the corresponding connection layer 20, 18 of the conventional electronic array 1.

While the invention has been particularly shown and described with reference to specific embodiments, it should be understood by those skilled in the art that various changes in form and detail may be made therein without departing from the spirit and scope of the invention as defined by the appended claims. The scope of the invention may be thus indicated by the appended claims and all changes which come within the meaning and range of equivalency of the claims may be therefore intended to be embraced.

What is claimed is:

1. An electronic array, comprising
a first electronic component having a first operation voltage,
a second electronic component which has a second operation voltage, wherein the second operation voltage is different from the first operation voltage and wherein the first electronic component and the second electronic component are arranged over each other,
an isolation layer between the first electronic component and the second electronic component, wherein the isolation layer electrically isolates the first electronic component from the second electronic component,
at least one connection layer formed at least partially at least one of between the isolation layer and the first electronic component or between the isolation layer and the second electronic component,
wherein the connection layer comprises a first portion and a second portion, wherein the first portion and the second portion each extend from the corresponding electronic component to the isolation layer, wherein the first portion comprises an electrically isolating material which fixes the isolation layer to the corresponding electronic component and wherein the second portion comprises an electrically conductive material which electrically couples the corresponding electronic component to the isolation layer.

2. The electronic array of claim 1,
wherein the at least one connection layer comprises:
a first connection layer formed at least partially between the isolation layer and the first electronic component, wherein the first connection layer comprises a first portion and a second portion of the first connection layer, wherein the first portion and the second portion of the first connection layer extend from the first electronic component to the isolation layer, wherein the first portion of the first connection layer comprises an electrically isolating material which fixes the isolation layer to the first electronic component and wherein the second portion of the first connection layer comprises an electrically conductive material which electrically couples the first electronic component to the isolation layer and/or
a second connection layer formed at least partially between the isolation layer and the second electronic component, wherein the second connection layer comprises a first portion and a second portion of the second connection layer, wherein the first portion and the second portion of the second connection layer extend from the second electronic component to the isolation layer, wherein the first portion of the second connection layer comprises an electrically isolating material which fixes the isolation layer to the second electronic component and wherein the second portion of the second connection layer comprises an electrically conductive material which electrically couples the second electronic component to the isolation layer.

3. The electronic array of claim 2, further comprising:
a first charge distribution layer formed between the first connection layer and the isolation layer, wherein the first and the second portion of the first connection layer extend from the first electronic component to the first charge distribution layer.

4. Electronic array according to claim 3,
wherein the first charge distribution layer contacts the isolation layer.

5. The electronic array of claim 2, further comprising:
a second charge distribution layer formed between the second connection layer and the isolation layer, wherein the first and the second portion of the second connection layer extend from the second electronic component to the second charge distribution layer.

6. The electronic array of claim 5,
wherein the second charge distribution layer contacts the isolation layer.

7. The electronic array of claim 2,
wherein at least one of the second portion of the first connection layer is embedded in the first portion of the first connection layer in a lateral direction or the second portion of the second connection layer is embedded in the first portion of the second connection layer in a lateral direction.

8. The electronic array of claim 2,
wherein at least one of the first portion or the second portion of the first connection layer are partially formed outside of the space between the first electronic component and the isolation layer.

9. The electronic array of claim 2,
wherein at least one of the first portion or the second portion of the second connection layer are partially formed outside of the space between the second electronic component and the isolation layer.

10. The electronic array of claim 2,
wherein at least one of the first portion of the first connection layer or the first portion of the second connection layer comprises at least one material selected from a group consisting of:
an adhesive;
a mold material; and
an embedding material.

11. The electronic array of claim 2,
wherein at least one of the second portion of the first connection layer or the second portion of the second connection layer comprises at least one of the following which extends from the corresponding electronic component to the isolation layer:
a conductive adhesive;
a conductive spacer;
a solid metal; and
one or more conductive particles.

12. The electronic array of claim 3,
wherein the first charge distribution layer comprises at least one of titanium nitride or doped silicon.

13. The electronic array of claim 5,
wherein the second charge distribution layer comprises at least one of titanium nitride or doped silicon.

14. The electronic array of claim 1,
wherein the second operation voltage is higher than the first operation voltage.

15. The electronic array of claim 1,
wherein the first electronic component comprises a first chip.

16. The electronic array of claim 1,
wherein the second electronic component comprises one of the following:
a carrier;
a second chip; and
a substrate.

17. A chip package comprising
a first chip;
a second chip, wherein the first chip is arranged over the second chip;
an isolation layer, wherein the isolation layer electrically isolates the first chip from the second chip;
at least one connection layer which is formed at least partially between the isolation layer and the first chip or between the isolation layer and the second chip;
wherein the at least one connection layer comprises at least one first portion and at least one second portion of the connection layer, wherein the first portion and the second portion of the connection layer extend from the corresponding chip to the isolation layer, wherein the first portion of the connection layer comprises an electrically isolating material and fixes the isolation layer to the corresponding chip and wherein the second portion comprises an electrically conductive material and provides an electrical bridge from corresponding chip to the isolation layer.

18. The chip package of claim 17,
wherein the at least one connection layer comprises:
a first connection layer which is formed at least partially between the isolation layer and the first chip, wherein the first connection layer comprises a first portion and a second portion of the first connection layer, wherein the first portion and the second portion of the first connection layer extend from the first chip to the isolation layer, wherein the first portion of the first connection layer comprises an electrically isolating material which fixes the isolation layer to the first chip and wherein the second portion of the first connection layer comprises an electrically conductive material which electrically couples the first chip to the isolation layer and/or a second connection layer which is formed at least partially between the isolation layer and the second chip, wherein the second connection layer comprises a first portion and a second portion of the second connection layer, wherein the first portion and the second portion of the second connection layer extend from the second chip to the isolation layer, wherein the first portion of the second connection layer comprises an electrically isolating material which fixes the isolation layer to the second chip and wherein the second portion of the second connection layer comprises an electrically conductive material which electrically couples the second chip to the isolation layer.

19. The chip package of claim 18, further comprising:

a first charge distribution layer between the first connection layer and the isolation layer, wherein the first and the second portion of the first connection layer extend from the first chip to the first charge distribution layer.

20. The chip package of claim 18, further comprising:

a second charge distribution layer between the second connection layer and the isolation layer, wherein the first and the second portion of the second connection layer extend from the second chip to the second charge distribution layer.

21. The chip package of claim 18, wherein at least one of the first portion of the first connection layer surrounds the second portion of the first connection layer in a lateral direction or the first portion of the second connection layer surrounds the second portion of the second connection layer in a lateral direction.

22. The chip package of claim 18, wherein at least one of the first portion or the second portion of the first connection layer protrude from the space between the first chip and the isolation layer.

23. The chip package of claim 18, wherein at least one of the first portion or the second portion of the second connection layer protrude from the space between the second chip and the isolation layer.

24. The chip package of claim 17, wherein an operation voltage of the second chip is higher than an operation voltage of the first chip.

25. The chip package of claim 17, wherein the chip package is configured as a current sensor.

* * * * *